(12) United States Patent
Kim et al.

(10) Patent No.: US 7,872,538 B2
(45) Date of Patent: Jan. 18, 2011

(54) IMPULSE GENERATION CIRCUIT

(75) Inventors: Young-Hwan Kim, Hwaseong-si (KR); Seong-Soo Lee, Suwon-si (KR); Hak-Sun Kim, Daejeon (KR); Chang-Seok Lee, Daejeon (KR); Soo-Yong Park, Daejeon (KR); Yu-Sin Kim, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1689 days.

(21) Appl. No.: 11/082,537

(22) Filed: Mar. 17, 2005

(65) Prior Publication Data

US 2005/0225371 A1    Oct. 13, 2005

(30) Foreign Application Priority Data

Mar. 17, 2004    (KR) .................... 10-2004-0017988

(51) Int. Cl.
*H03B 1/00* (2006.01)
(52) U.S. Cl. .................... 331/74; 333/107; 333/109; 327/171; 327/172
(58) Field of Classification Search ................ 327/171, 327/172; 331/74; 333/107, 109
See application file for complete search history.

(56) References Cited

U.S. PATENT DOCUMENTS

| 3,967,140 | A | 6/1976 | Andrews |
| 6,452,467 | B1 * | 9/2002 | McEwan .................... 333/240 |
| 6,535,161 | B1 * | 3/2003 | McEwan .................... 342/124 |

OTHER PUBLICATIONS

Korean Office Action issued on Sep. 30, 2010, in corresponding Korean Application No. 10-2004-0017988 (4 pages).

* cited by examiner

*Primary Examiner*—Arnold Kinkead
(74) *Attorney, Agent, or Firm*—NSIP Law

(57) ABSTRACT

An impulse generation circuit is provided for generating an impulse using a transmission line. Impulse characteristics of the impulse generation circuit are varied with the length of a transmission line rather than the characteristic variation of various devices used therein. The length of the transmission line is adjusted, such that a width of a generated pulse is adjusted. Because an end of the transmission line is short-circuited, the transmission line length can be easily adjusted on a substrate, and a ringing phenomenon due to re-reflection can be removed using termination impedance.

6 Claims, 8 Drawing Sheets

IMPULSE GENERATION CIRCUIT

PRIORITY

This application claims priority to an application entitled "IMPULSE GENERATION CIRCUIT", filed in the Korean Intellectual Property Office on Mar. 17, 2004 and assigned Serial No. 2004-17988, the contents of which are incorporated herein by reference.

BACKGROUND OF THE INVENTION

1. Field of the Invention

The present invention relates generally to an impulse generation circuit, and more particularly to an impulse generation circuit using a transmission line.

2. Description of the Related Art

Conventionally, and as used herein, the term "impulse" refers to any short-duration voltage, current, or wave signal that is used to generate a large amplitude. A periodic impulse signal is referred to as a pulse. However, the term "pulse" is a generic term that includes an impulse and a pulse.

Such a pulse includes a clock pulse and a frame pulse, and is used in a bit synchronization system and a frame synchronization system. More specifically, pulses are widely used in a multiplexing transmission system, a switching system, and a very high-speed communication and positioning system. Each of the above-mentioned systems include an impulse generation circuit for generating a pulse or impulse.

The existing impulse generation circuits can be based on the instant reverse conduction characteristics of a diode, or based on an RC differentiator circuit configured by a resistor R and a capacitor C, etc.

Figure 1:
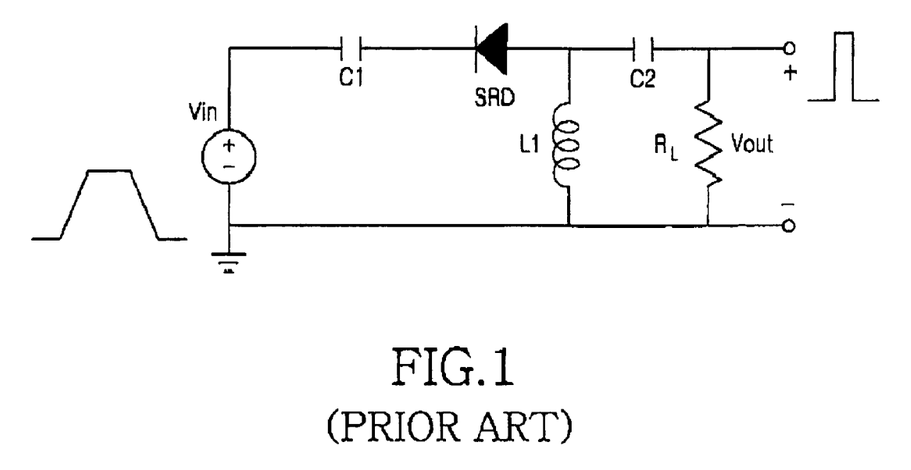
FIG. 1 is a circuit diagram illustrating a conventional impulse generation circuit using a diode.

FIG. 1 is a circuit diagram illustrating an example of a conventional impulse generation circuit based on the reverse conduction characteristics of the diode.

Referring to FIG. 1, an input voltage Vin from a power supply is supplied to a capacitor C1. After the voltage Vin is gradually boosted, it drops when a predetermined time has elapsed. The voltage Vin is supplied to a diode SRD through the capacitor C1. The diode used herein is a step recovery diode (SRD). The diode SRD generates an impulse with a predetermined pulse width when the reverse conduction is instantly made at an arbitrary point by the gradual boosting of the voltage Vin. The pulse width depends upon characteristics of the diode SRD used. The diode SRD is sensitive to a temperature variation. The impulse with the predetermined pulse width generated by the instant reverse conduction of the diode SRD is produced as an output Vout.

Figure 2:
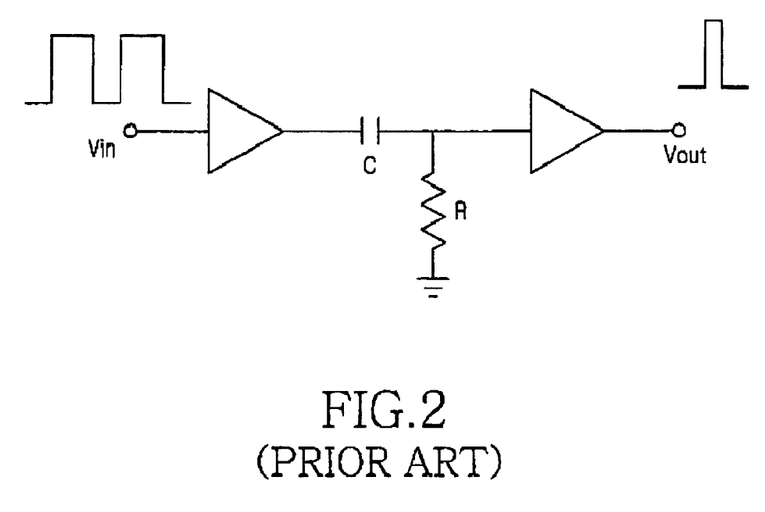
FIG. 2 is a circuit diagram illustrating a conventional impulse generation circuit using a differentiator circuit.

FIG. 2 is a circuit diagram illustrating an example of a conventional impulse generation circuit based on the RC differentiator circuit.

Referring to FIG. 2, an input signal with a predetermined period and pulse width is amplified to a desired level through an amplifier. The amplified signal is input into the differentiator circuit configured by a capacitor C and a resistor R. The differentiator circuit generates an output signal that is proportional to a rate at which the input signal is changed over time. The output signal is an impulse signal. The impulse signal generated by the differentiator circuit is amplified to a desired level, such that the final output signal Vout is generated. The impulse width depends upon values of the resistor R and the capacitor C that comprise the differentiator circuit. However, the impulse generation circuit using the RC differentiator circuit has irregular characteristics due to input/output impedance dispersion of a used active device as well as dispersion of values of the resistor R and the capacitor C. Fine adjustment of the characteristics is relatively difficult.

Figure 3:
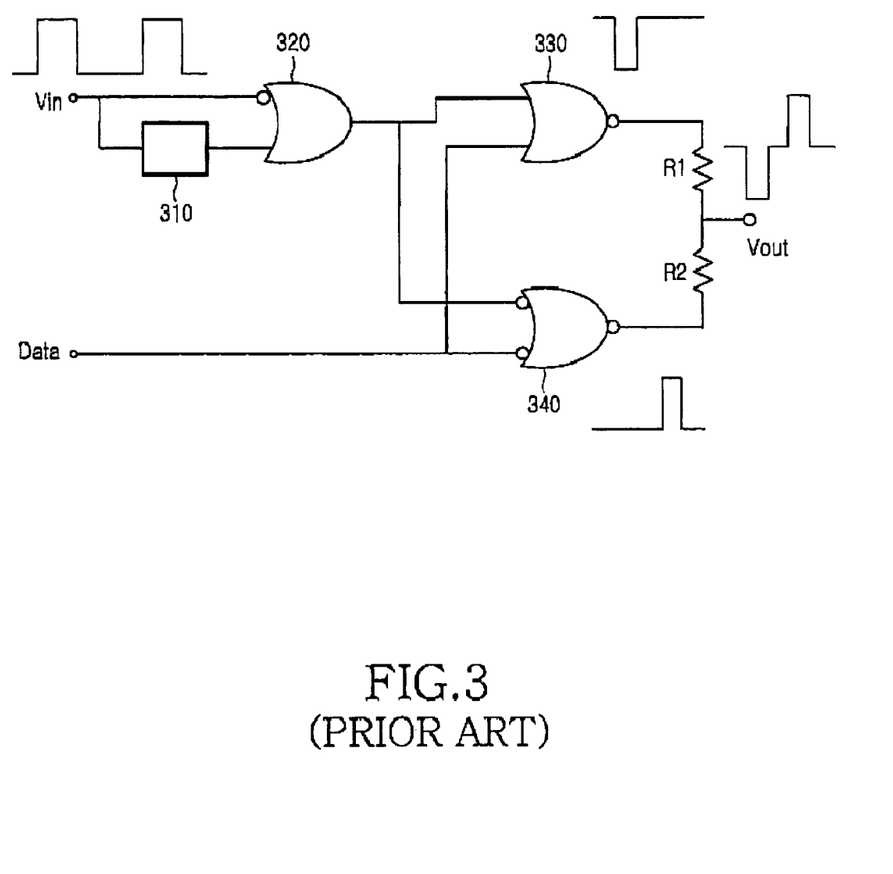
FIG. 3 is a circuit diagram illustrating a conventional impulse generation circuit using a delay line.

FIG. 3 is a circuit diagram illustrating a conventional impulse generation circuit that can adjust a pulse width using a delay time according to the length of a transmission line.

Referring to FIG. 3, an input pulse Vin is inverted, and the inverted pulse is one input of an OR gate 320 serving as a first logic element. A delay line 310 delays the input pulse Vin for a predetermined delay time, and the delayed pulse is the other input of the OR gate 320. The OR gate 320 performs an OR operation on the two inputs to generate an output pulse with a predetermined width. The delay time depends upon the length of the delay line 310. The pulse width depending upon the delay time is adjusted by the length of the delay line 310. The pulse output from the OR gate 320 is one input of a NOR gate 330 serving as a second logic element. The NOR gate 330 receives data at its second input. The NOR gate 330 performs a NOR operation on the pulse and data inputs, thereby outputting one desired pulse. An exclusive NOR gate 340 serving as a third logic element performs an exclusive NOR operation on a signal input obtained by inverting the pulse output from the OR gate 320 and the data input, thereby outputting the other desired pulse. The pulses output from the NOR gate 330 and the exclusive NOR gate 340 are combined, such that the final output signal Vout is output. As described above, the impulse generation circuit with the structure of FIG. 3 can produce a desired pulse width by adjusting the length of the delay line 310. However, because the adjustment of the delay line length is not easy, it is difficult for the pulse width to be finely adjusted.

SUMMARY OF THE INVENTION

The adjustment of a pulse waveform and a pulse width is not easy in the conventional impulse generation circuits using the above-described methods. When the conventional impulse generation circuits are used, system performance may be degraded due to device characteristic variations, temperature variations, etc.

Therefore, it is an aspect of the present invention to provide an impulse generation circuit that generates an impulse using a transmission line.

It is another aspect of the present invention to provide an impulse generation circuit that adjusts a pulse width using the length of a transmission line.

It is another aspect of the present invention to provide an impulse generation circuit that prevents a ringing phenomenon due to re-reflection.

It is another aspect of the present invention to provide a circuit that generates an impulse using reflection in a transmission line whose end is short-circuited.

It is another aspect of the present invention to provide an impulse generation circuit that prevents a ringing phenomenon by preventing a reflected signal from being re-reflected using a resistor at an end of a drive terminal.

It is another aspect of the present invention to provide an impulse generation circuit that minimizes the termination impedance variation by making use of a drain terminal and a collector terminal of a transistor as output terminals.

It is yet another aspect of the present invention to provide an impulse generation circuit that can easily adjust a pulse width according to the length of an external transmission line and can be easily implemented in an integrated structure.

The above and other aspects of the present invention can be achieved by an impulse generation circuit for generating an impulse whose pulse width can be adjusted. The impulse generation circuit includes a power supply for generating a predetermined rectangular wave; and an impulse generator having two terminals for receiving the rectangular wave through an input terminal of the two terminals, and short-circuiting the other terminal of the two terminals, causing the rectangular wave and a reflected signal to cancel each other out, and generating an impulse signal with a predetermined pulse width in the input terminal, the reflected signal being generated by reflecting a signal with a polarity opposite to that of the rectangular wave for a predetermined delay time.

BRIEF DESCRIPTION OF THE DRAWINGS

The above and other aspects and advantages of the present invention will be more clearly understood from the following detailed description taken in conjunction with the accompanying drawings, in which.

DETAILED DESCRIPTION OF THE PREFERRED EMBODIMENTS

Preferred embodiments of the present invention will be described in detail herein below with reference to the accompanying drawings. Although the present invention will be described with respect to representative embodiments, other embodiments and variations are within the scope of the present invention.

An embodiment of the present invention to be described below generates an impulse having a width corresponding to a predetermined time by causing an input signal and a reflected signal to cancel each other out. The reflected signal has a polarity opposite to that of the input signal when the predetermined time has elapsed. For this purpose, the embodiment of the present invention includes a reflection delay device for generating the reflected signal in which the polarity of the input signal is inverted when the predetermined time (reflection time) has elapsed after a signal input. The reflection delay device can be implemented using a transmission line. One end of the transmission line is short-circuited to reflect the input signal. The short-circuited end may be grounded. A desired impulse width can be finely adjusted by changing the position of the transmission line is grounded on a substrate. In accordance with an embodiment of the present invention, a re-reflection prevention device is provided at the input end, i.e. the end not short-circuited, to prevent a ringing phenomenon when the reflected signal is re-reflected. The re-reflection prevention device can be implemented using termination impedance having the same value as that of characteristic impedance of the transmission line.

Figure 4:
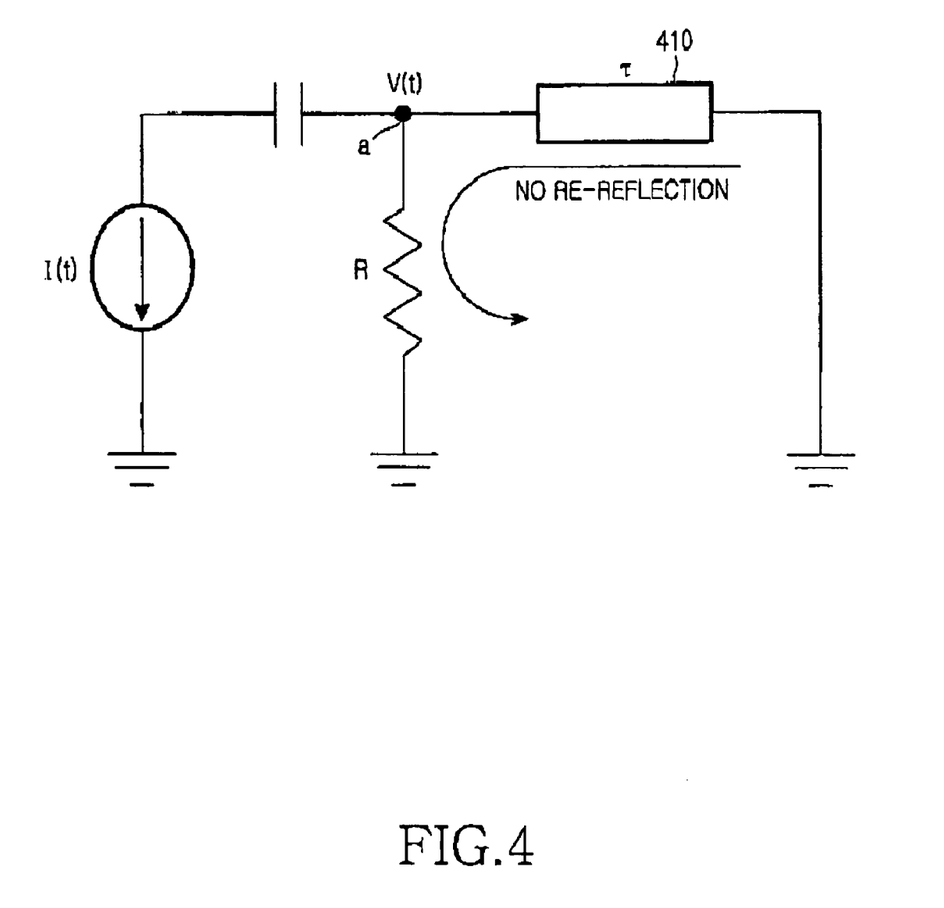
FIG. 4 is a circuit diagram illustrating a principle of generating an impulse using a transmission line in accordance with an embodiment of the present invention.
Figure 5:
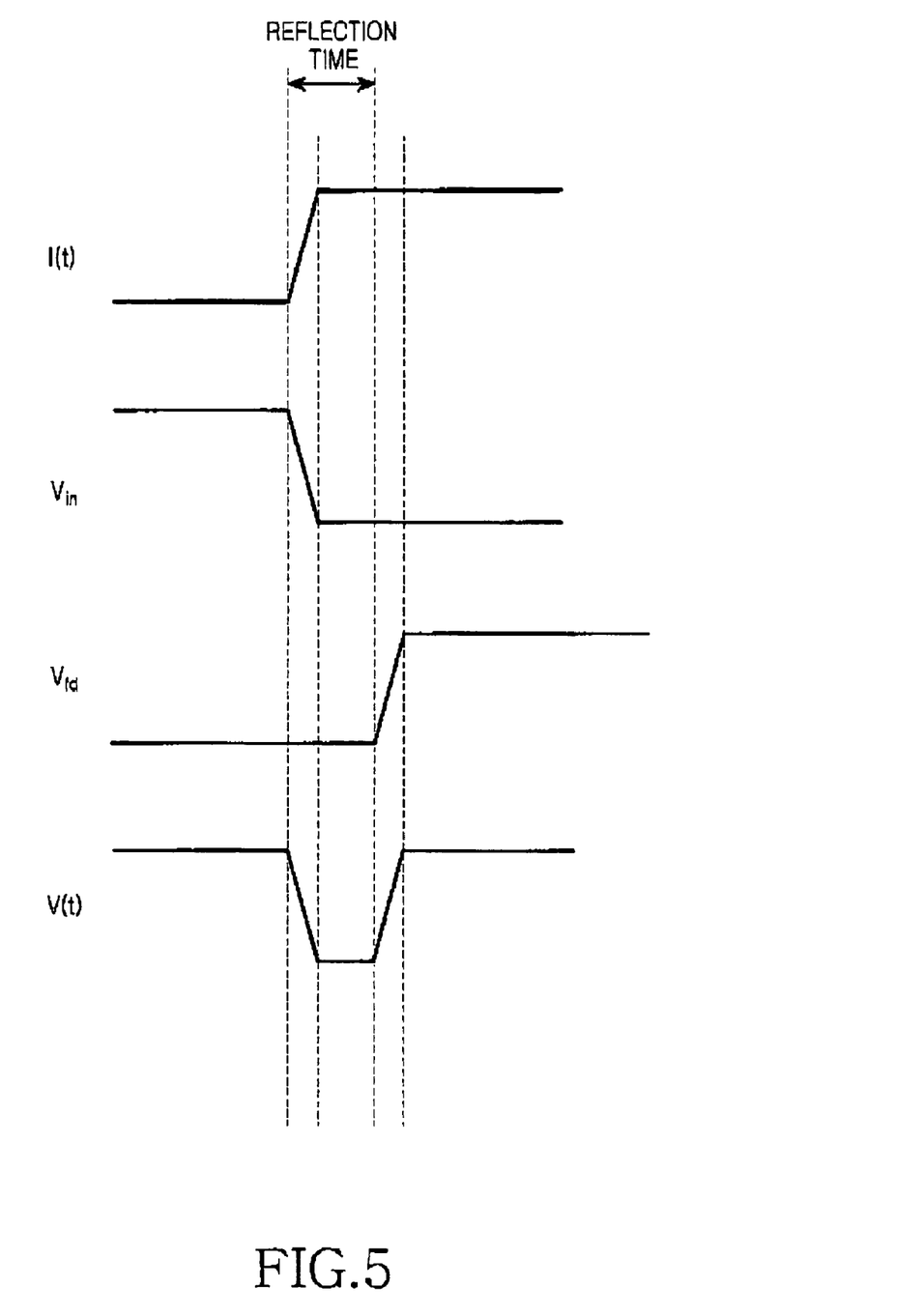
FIG. 5 illustrates pulse waveforms generated from components of FIG. 4.

FIG. 4 is a circuit diagram illustrating a principle of generating an impulse using a transmission line in accordance with an embodiment of the present invention, and FIG. 5 illustrates pulse waveforms generated from components of FIG. 4.

Referring to FIGS. 4 and 5, a rectangular wave having abrupt variation characteristics in which a rise time is reduced, that is, I(t), is generated. A waveform of I(t) is illustrated in FIG. 5. A voltage $V_{in}$ with the waveform illustrated in FIG. 5 is input at a point "a" of an input end of the transmission line 410 according to the rectangular wave I(t). When the voltage $V_{in}$ is applied, the transmission line 410 operates as a resistor having the same value as its own characteristic impedance value. Accordingly, a voltage V(t) measured at the input end of the transmission line 410, that is, the point "a", is equal to the voltage $V_{in}$ applied to the transmission line 410. A signal of the voltage $V_{in}$ applied to the transmission line 410 travels at near light speed through the transmission line 410. Because the other end of the transmission line 410 is short-circuited, a reflected signal $V_{fd}$ is fed back and arrives at the point "a". The reflected signal $V_{fd}$ has a polarity opposite to that of the voltage $V_{in}$. Accordingly, the reflected signal $V_{fd}$ is added to the voltage $V_{in}$. When the reflected signal $V_{fd}$ is added to the voltage $V_{in}$, a resulting waveform is the same as that of the voltage V(t) illustrated in FIG. 5. It can be seen that the waveform of the voltage V(t) has a desired impulse waveform. A termination impedance R having the same value as that of characteristic impedance of the transmission line 410 may be connected between point "a" and ground. The termination impedance R prevents the reflected and fed-back signal from being re-reflected.

Figure 6:
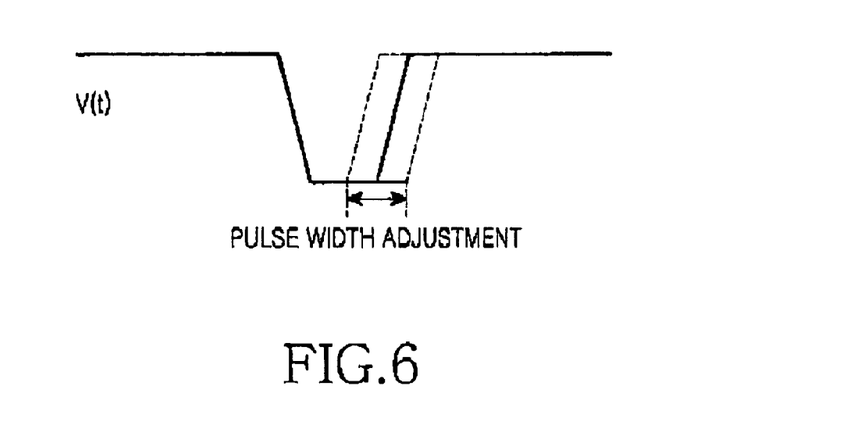
FIG. 6 illustrates an example in which a pulse width is adjusted by adjusting the length of the transmission line of FIG. 4.

As mentioned above, the width of the generated pulse at the point "a" is determined by the reflection time serving as the time needed to reflect and feed back the signal. The reflection time can be defined as illustrated in FIG. 5. When the reflection time is long, the pulse width is wide. When the reflection time is short, the pulse width is narrow. The reflection time is proportional to the length of the transmission line 410. When the length of the transmission line 410 is adjusted, the pulse width can be adjusted as illustrated in FIG. 6. An operation in which an impulse is generated by a signal in a rising time has been described with reference to FIGS. 4 and 5. A desired impulse can be generated by a signal in a falling time.

Figure 7:
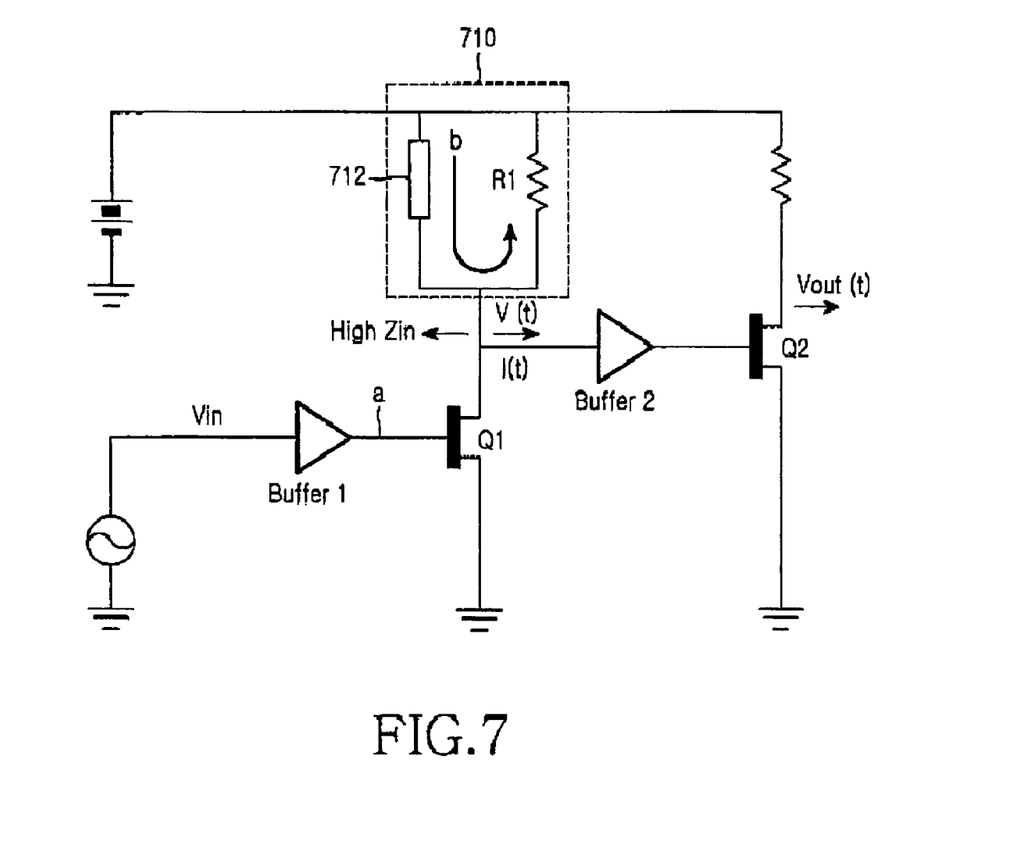
FIG. 7 is a circuit diagram illustrating an impulse generation circuit in accordance with an embodiment of the present invention.

FIG. 7 is a circuit diagram illustrating an impulse generation circuit in accordance with an embodiment of the present invention. Referring to FIG. 7, the impulse generation circuit of the present invention is fabricated on an external substrate and is constructed to generate an impulse having a pulse width, determined by the length of a transmission line connected to the substrate, in a rising or falling time of an input rectangular wave signal.

The impulse generation circuit of FIG. 7 includes a buffer circuit, an impulse generator 710, termination impedance, and an output device. The buffer circuit abruptly varies the rectangular wave signal by reducing the rising and falling times of the rectangular wave signal regardless of rising and falling characteristics of the input rectangular wave signal. The impulse generator generates an impulse with a specific time width from an output of the buffer circuit. The termination impedance prevents a reflected signal from being re-reflected to the impulse generator. The output device amplifies and outputs only one of two impulse signals with different polarities generated from the impulse generator and a transistor with high output impedance in an ON or OFF state.

Figure 8:
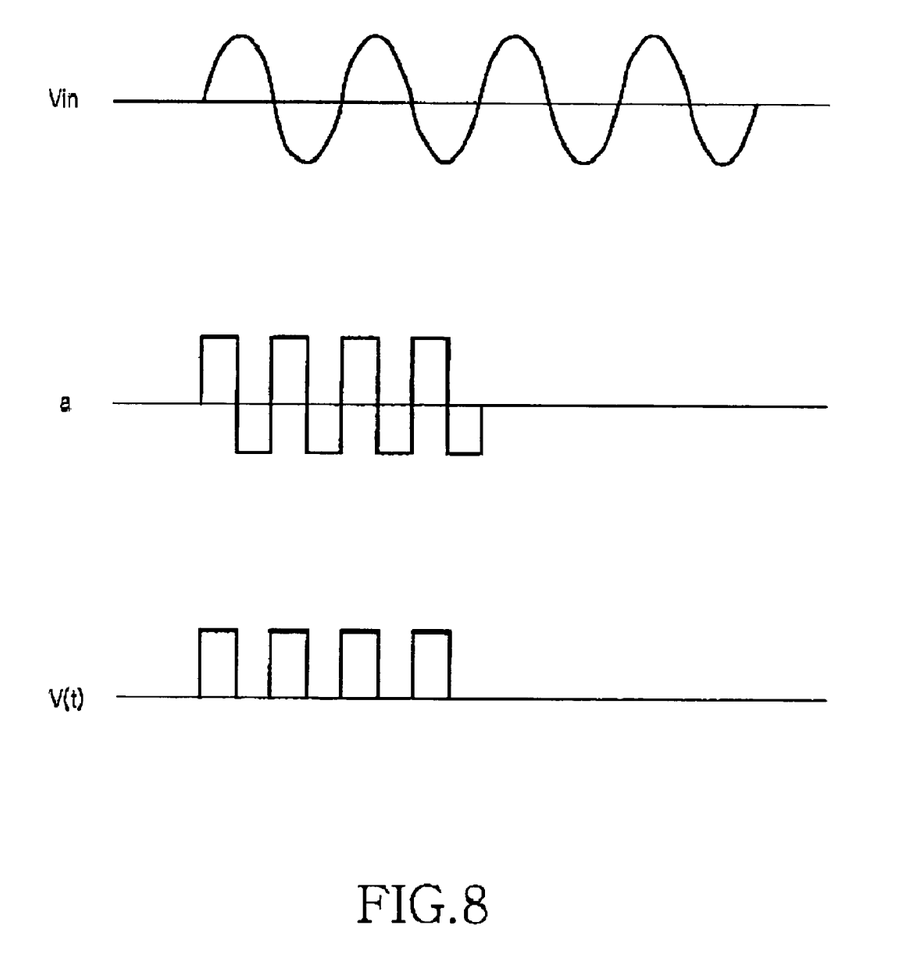
FIG. 8 illustrates pulse waveforms generated from components of FIG. 7.

Referring to FIG. 7, a voltage Vin generated by a power supply is input into a first buffer Buffer 1. The first buffer Buffer 1 outputs a rectangular wave with abrupt variation characteristics in which the rising or falling time is reduced in a signal of the voltage Vin. The rectangular wave output from the first buffer Buffer 1 at a point "a" and the voltage Vin are illustrated in FIG. 8. The rectangular wave output from the first buffer Buffer 1 is input into a base terminal of a transistor Q1. The transistor Q1 uses a transistor with high output impedance "HIGH Zin" in the ON or OFF state. In response to an output signal of the first buffer Buffer 1, the transistor Q1 operates in the ON or OFF state. When a predetermined input signal is applied to a transmission line 712 included in the impulse generator 710, the transmission line 712 operates as a resistor having the same value as that of its own characteristic impedance. Accordingly, a voltage at an input end of the transmission line 712 is the same as the input voltage. The voltage signal applied to the transmission line 712 travels at near light speed through the transmission line 712, and is reflected as a signal with a polarity opposite to that of the applied signal. The signal with the opposite polarity is reflected because the other end of the transmission line 712 is short-circuited. When the reflected signal arrives at the input end of the transmission line 712, the reflected signal and the voltage signal according to the ON/OFF state of the transistor Q1 cancel each other out. Accordingly, a desired impulse waveform is generated at an input terminal of the impulse generator 710. The impulse waveform generated at the input terminal of the impulse generator 710 is equal to the waveform of V(t) illustrated in FIG. 8.

When the length of the transmission line 712 is adjusted, a width of the impulse generated at the input terminal of the impulse generator 710 can be adjusted. To prevent a reflected and fed back signal from being re-reflected, terminal impedance R1 is connected. Terminal impedance R1 has the same value as that of characteristic impedance of the transmission line 712. To minimize the termination impedance variation, a transistor Q2 with high output impedance is connected. The above-mentioned operation is equally applied to a case when the rectangular wave is in the falling time thereof. Accordingly, only one of two impulses generated in the rising and falling times of the rectangular wave needs to be selected. This can be attained by selecting a type of device used for a second buffer Buffer 2 and a bias of the transmission line 712 are appropriately adjusted.

Simulation output characteristics of the impulse generation circuit proposed in the embodiment of the present invention are illustrated in FIGS. 9A and 9B and FIGS. 10A and 10B. In this case, it is assumed that a transmission line width W is 0.267 mm, a transmission line length L is 15 mm, and termination impedance uses a resistor of 100 Ω.

Figure 9A:
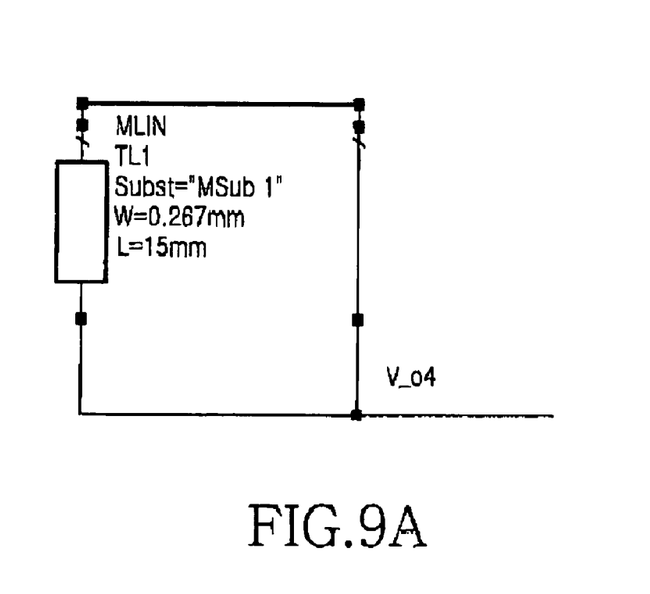
FIGS. 9A and 9B illustrate a configuration and an output waveform when termination impedance for preventing re-reflection is not used.
Figure 9B:
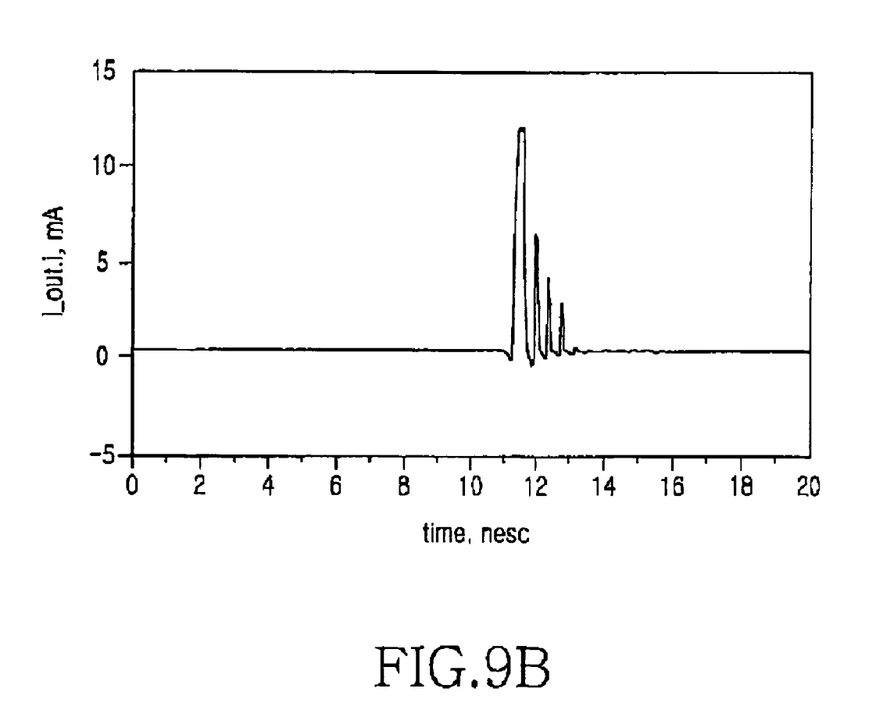
Figure 10A:
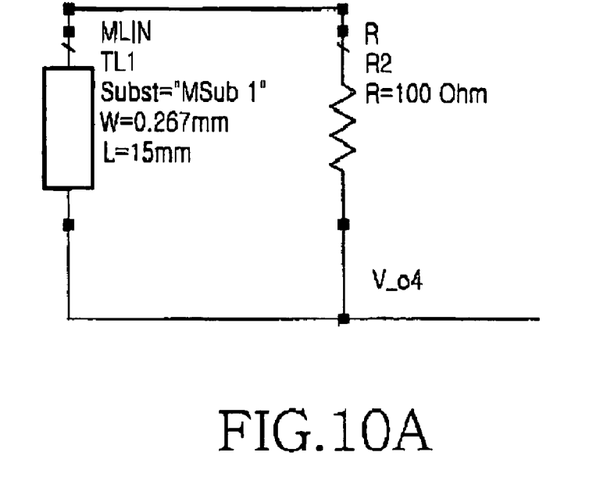
FIGS. 10A and 10B illustrate a configuration and an output waveform when termination impedance for preventing re-reflection is used.
Figure 10B:
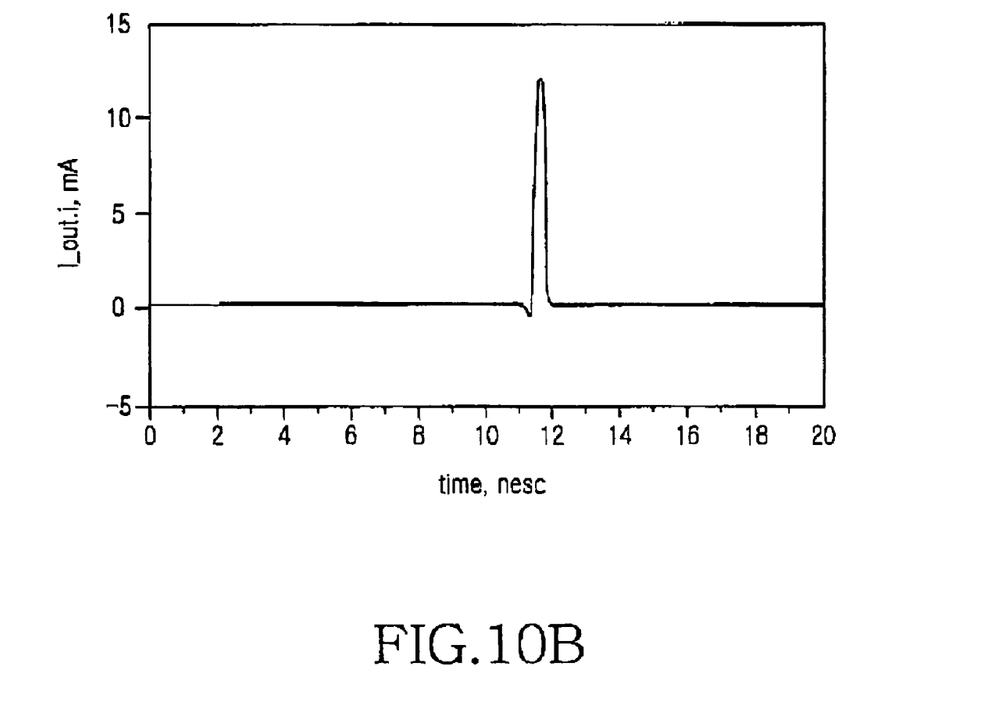

FIGS. 9A and 9B illustrate a configuration and an output waveform when termination impedance for preventing re-reflection is not used, and FIGS. 10A and 10B illustrate a configuration and an output waveform when termination impedance for preventing re-reflection is used.

When a termination resistance component is not connected to the transmission line as illustrated in FIG. 9A, the amount of ringing increases due to re-reflection of an output signal as illustrated in FIG. 9B. However, when a termination resistance component is connected to the transmission line as illustrated in FIG. 10A, a ringing component is not generated as illustrated in FIG. 10B, because re-reflection of an output signal is removed.

As apparent from the above description, because impulse characteristics of an impulse generation circuit are varied with the length of a transmission line rather than characteristic variation of various devices used therein, the present invention can adjust a width of a generated pulse by adjusting the length of the transmission line. Because an end of the transmission line is short-circuited, the transmission line length can be easily adjusted on a substrate, and a ringing phenomenon due to re-reflection can be removed using termination impedance.

What is claimed is:

1. An impulse generation circuit for generating an impulse whose pulse width can be adjusted, comprising:
   a power supply for generating a predetermined rectangular wave; and
   an impulse generator for receiving the rectangular wave through a first of two terminals, and short-circuiting a second of the two terminals, canceling the rectangular wave with a reflected signal, and generating an impulse signal with a predetermined pulse width in the first terminal, the reflected signal being generated by reflecting a signal with a polarity opposite to that of the rectangular wave for a predetermined delay time.

2. The impulse generation circuit according to claim 1, wherein the impulse generator includes a transmission line with characteristic impedance.

3. The impulse generation circuit according to claim 2, wherein the delay time is determined by a length of the transmission line, such that the pulse width is adjusted.

4. The impulse generation circuit according to claim 1, further comprising:
   a termination impedance for preventing the reflected signal from being re-reflected, wherein one end of the termination impedance is connected to the first terminal of the impulse generator and a second end of the termination impedance is short-circuited.

5. The impulse generation circuit according to claim 4, further comprising:
   a transistor having a high input impedance for minimizing a variation of the termination impedance, wherein the gate of the transistor is connected as an input terminal, and the drain of the transistor is connected as an output terminal.

6. The impulse generation circuit according to claim 1, further comprising:
   an input buffer for reducing a rising or falling time of the rectangular wave from the power supply, and abruptly varying the rectangular wave in the rising or falling time.

* * * * *